United States Patent [19]
Tempel

[11] Patent Number: 6,025,626
[45] Date of Patent: Feb. 15, 2000

[54] NONVOLATILE MEMORY CELL

[75] Inventor: Georg Tempel, Zorneding, Germany

[73] Assignee: Siemens, Aktiengesellschaft, Munich, Germany

[21] Appl. No.: 09/274,500

[22] Filed: Mar. 23, 1999

Related U.S. Application Data

[63] Continuation of application No. PCT/DE97/02066, Sep. 15, 1997.

[51] Int. Cl.$^7$ .................................................. H01L 29/788
[52] U.S. Cl. .......................... 257/315; 257/316; 257/317; 257/321
[58] Field of Search ..................................... 257/315, 316, 257/330, 331, 314, 317–321; 438/259

[56] References Cited

U.S. PATENT DOCUMENTS 5,429,970   7/1995   Hong ........................................ 257/316

*Primary Examiner*—Tom Thomas
*Assistant Examiner*—Thien F Tran
*Attorney, Agent, or Firm*—Herbert L. Lerner; Laurence A. Greenberg

[57] ABSTRACT

The invention relates to a self-adjusted nonvolatile memory cell, in which a MOS transistor with source and drain regions is incorporated into the surface region of a semiconductor body. The floating gate and the control gate of the MOS transistor are accommodated, overlapping one another, in a recess trench, while the transistor channel is guided laterally in a surface region of the trench.

4 Claims, 6 Drawing Sheets

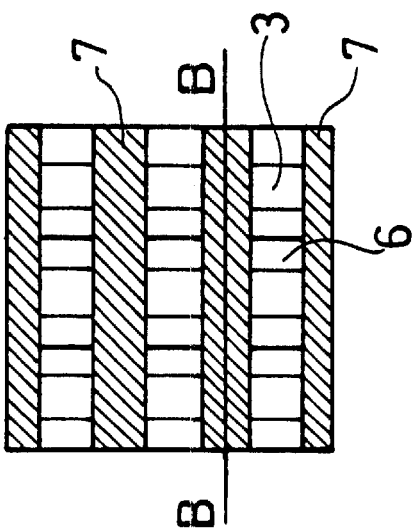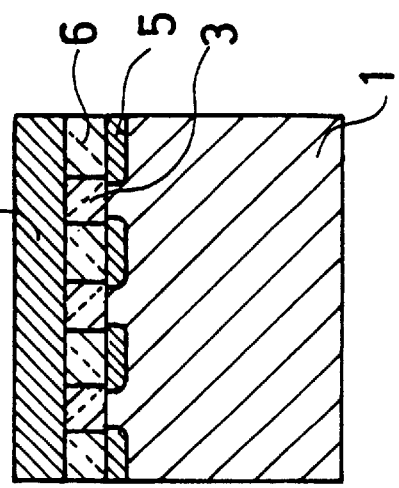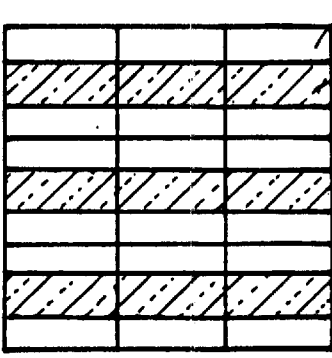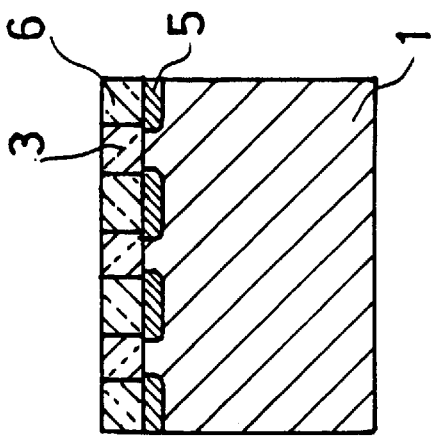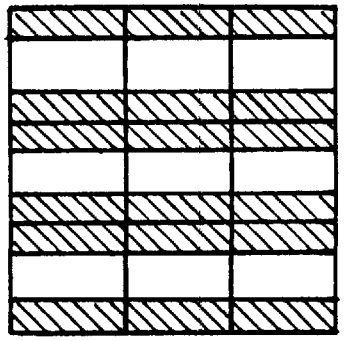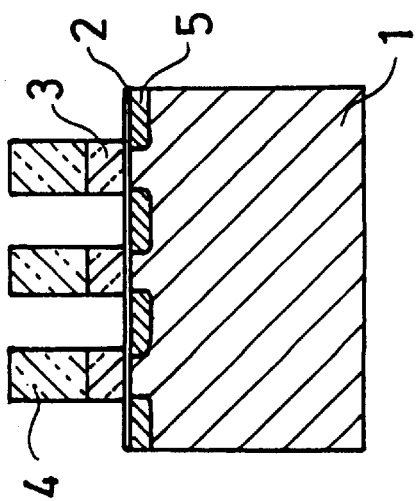

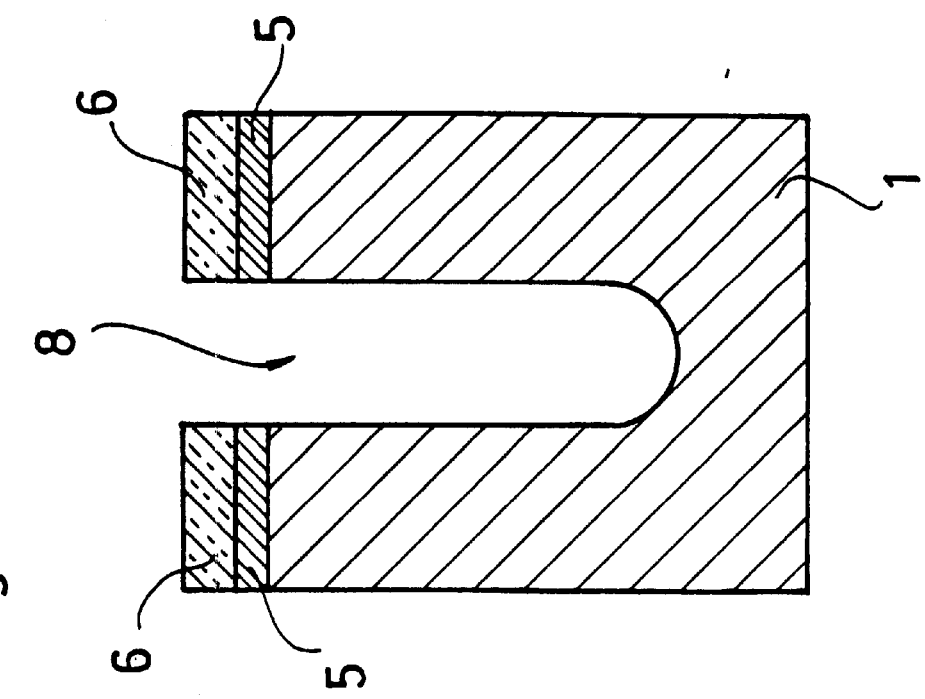
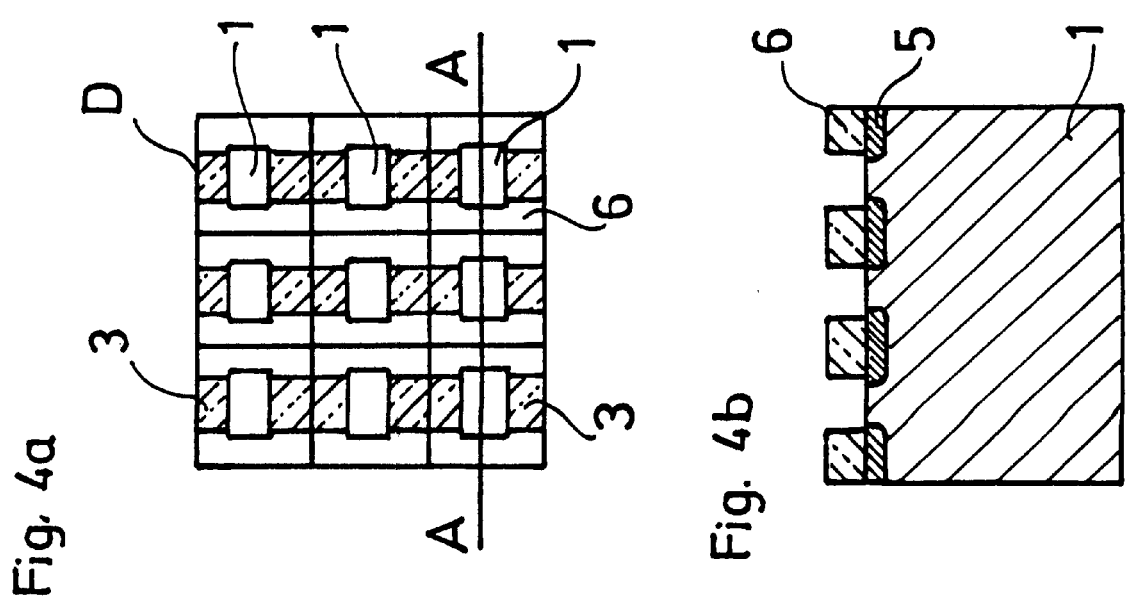

Fig. 11
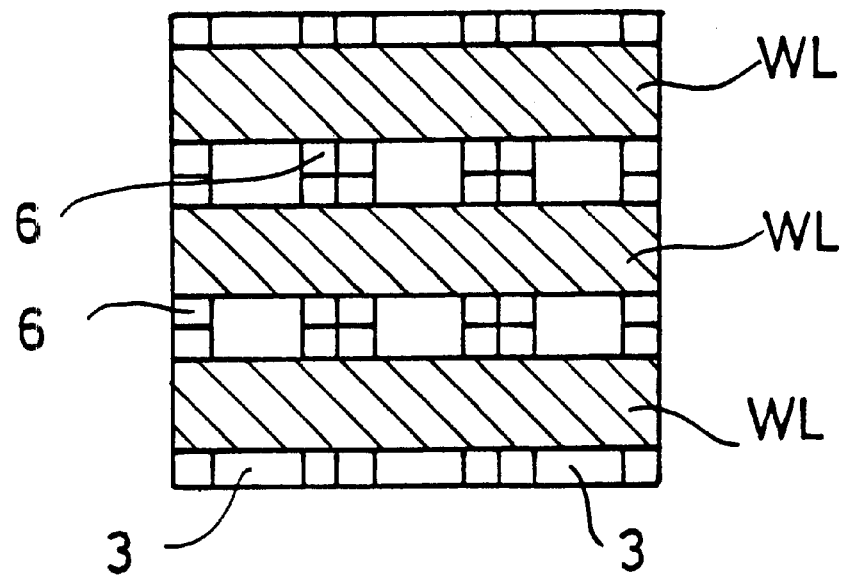
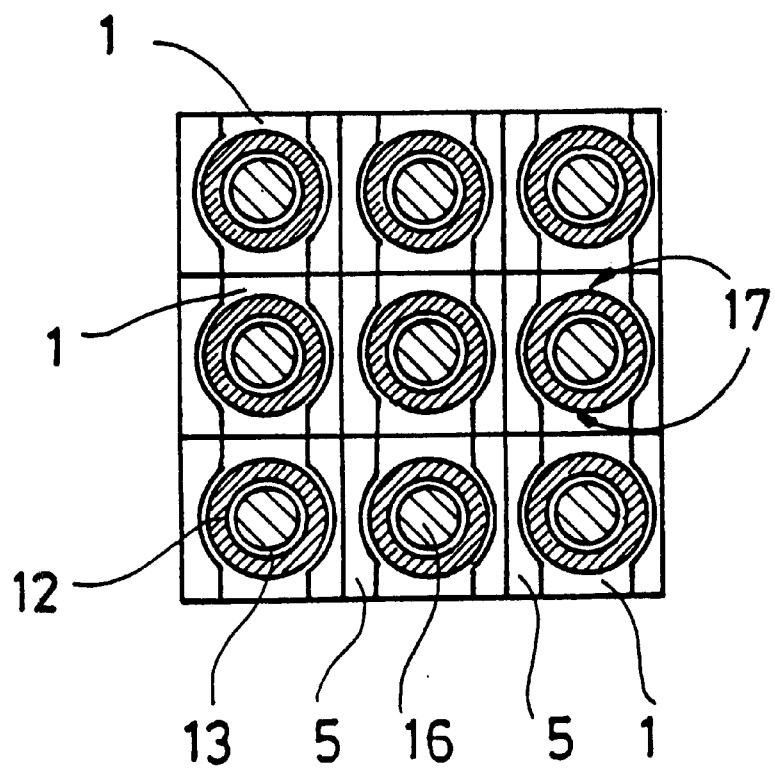
Fig. 12

NONVOLATILE MEMORY CELL

CROSS-REFERENCE TO RELATED APPLICATION

This is a continuation of copending International Application PCT/DE97/02066, filed Sep. 15, 1997, which designated the United States.

BACKGROUND OF THE INVENTION

1. Field of the Invention

The invention lies in the field of semiconductor manufacture. Specifically, the invention relates to a nonvolatile memory cell having source and drain regions formed in a surface of a semiconductor substrate and spaced apart from one another by a channel region. A fully insulated storage gate electrode is implemented as a cup in a recess of the semiconductor substrate. A control gate electrode, which for capacitive coupling with the storage gate electrode protrudes into the substrate recess. The substrate recess receiving the gate electrode is formed between the source and the drain region.

Typical nonvolatile memory cells are based on what is known as the floating gate (FG) concept. The term floating gate will be used below for the storage gate electrode, for storing a charge. In the floating gate concept, an electrically fully insulated gate, namely the floating gate, which is typically of polycrystalline silicon, forms the actual storage gate. This floating gate is capacitively coupled to a further gate, namely the control gate (CG), or the control gate electrode, and is controlled by it. The floating gate and the control gate are located in two different planes, which are separated from one another by an insulation layer, such as a silicon dioxide layer. The control gate, like the floating gate, also typically comprises polycrystalline silicon.

Because of the high programming voltages required in memories with such memory cells, the capacitive coupling of this voltage to the floating gate should be as high as possible, which can be attained by means of correspondingly large overlapping surface areas between the floating gate and the control gate. In other words, the region in which the floating gate and the control gate overlap should be designed to be as large as possible. Clearly, this need is in conflict with the general demand for increasing the scale of integration, because especially by forming lateral overlapping regions between the floating gate and the control gate, valuable chip area is lost.

A nonvolatile memory cell as generically described in the introductory paragraph is known from U.S. Pat. No. 5,392,237 to Iida. With the cup-shaped recess in the semiconductor substrate there, and the storage gate and control gate electrodes formed in it, a memory cell with small lateral dimensions and an increased degree of coupling between the storage gate and control gate electrodes is obtained. However, there, the transistor channel forms into the substrate, around the recess, because there is a thick oxide film on the substrate surface. Increasing the coupling factor cannot be achieved by lengthening the recess in this known memory cell, however, because the coupling of the storage gate electrode to the substrate increases to the same extent as its coupling to the control gate electrode.

A nonvolatile memory cell with an improved coupling factor over conventional memory cells is known from JP-A 61085468 (Patent Abstracts of Japan). However, there only a part of the storage gate electrode region, which protrudes past the region of the transistor channel, is disposed in an recess, rather than the entire storage gate electrode. Otherwise, that memory cell is of conventional design.

Memory cells of this type are also known from U.S. Pat. No. 4,814,840 to Kameda and U.S. Pat. No. 5,045,490 to Esguivel et al. There, however, the entire portion of the storage gate electrode that protrudes past the transistor region is disposed in trenches disposed in the substrate on both sides of a channel, and one trench is used for two adjacent memory cells.

A laterally embodied overlapping region between the floating gate and the control gate is described for instance by Y. S.

Hisamune et al., Int. Electron Dev. Meeting 1993 (IEDM), Washington, pages 19–22.

To attain the large overlapping region between the floating gate and the control gate that is desired yet still economize on chip area, the idea has also already been proposed of integrating nonvolatile memory cells vertically in a trench structure. Such a concept, in which the drain is placed on top of a trench and the source at the bottom, for instance, so that the transistor channel extends perpendicular to the chip surface, along the wall of the trench, is explained for instance by H. P. Pein et al., IEDM 93, pages 11–14. However, for construction reasons, the structure shown there does not have a very high capacitive coupling.

Better capacitive coupling is attained if the side wall of the polycrystalline silicon of the floating gate is utilized. This concept, but in which the topography of the memory cell is higher, is described for instance by S. Aritome et al., IEDM 94, San Francisco, pages 61–64, or S. Aritome et al., IEDM 95, Washington, pages 275–78.

SUMMARY OF THE INVENTION

It is accordingly an object of the invention to provide a non-volatile memory cell, which overcomes the above-mentioned disadvantages of the heretofore-known devices and methods of this general type and which is distinguished by good coupling between the floating gate and the control gate, and by reduced effort and expense for the topography.

With the foregoing and other objects in view there is provided, in accordance with the invention, a non-volatile memory cell, comprising:

a semiconductor substrate having a surface formed with source and drain regions and a channel region formed between the source and drain regions;

the semiconductor substrate having a cup-shaped recess formed therein between the source and drain regions;

a fully insulated storage gate electrode disposed in the recess in the semiconductor substrate;

a control gate electrode protruding into the recess and capacitively coupled with the storage gate electrode;

a gate oxide disposed between and insulating the storage gate electrode from the semiconductor substrate, the gate oxide being relatively thinner in a region at the surface of the semiconductor than in the recess; and the channel region, at the relatively thinner gate oxide, extending horizontally around the recess at the surface of the semiconductor substrate.

In accordance with an added feature of the invention, the storage gate electrode embraces the control gate electrode in a U, and the control gate electrode is disposed centrally in the recess.

In accordance with an additional feature of the invention, a number of silicon dioxide layers completely surround the storage gate electrode.

In accordance with a concomitant feature of the invention, the storage gate electrode and the control gate electrode each comprise doped polycrystalline silicon.

In the non-volatile memory cell of the invention, accordingly—as in the prior art also—the third dimension in the depth of a cup-shaped recess—hereinafter called a trench—is utilized to furnish a large overlapping region and hence a high coupling capacitance between the floating gate and the control gate. However, in the memory cell of the invention, in contrast to the prior art, the transistor channel extends in the region of the trench near the surface, not along its side wall. In contrast to conventional vertical transistors, in which the transistor channel is embodied vertically, in the non-volatile memory cell of the invention a lateral transistor channel is present on the side wall of the trench.

The trench is circular in structure and the source and drain regions are located on both sides of the trench in the surface region of the semiconductor body.

In the method of the invention, chemical-mechanical polishing (CMP) is utilized in particular. As a result, at the end planar memory cell fields are finally attained, which are excellently well suited for subsequent lithographic operations.

Finally, by means of a virtual-ground arrangement of the memory cell, a cell area of $4F^2$ can be attained; F stands for the minimum feature size.

Other features which are considered as characteristic for the invention are set forth in the appended claims.

Although the invention is illustrated and described herein as embodied in a non-volatile memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1a, 1b, 2a, 2b, 3a, 3b, 4a, 4b, a respective pairs of plan and sectional views illustrating the fabrication method according to the invention, whereby FIG. 3b is a section along the line B—B in FIG. 3a and FIG. 4b is a section along the line A—A in FIG. 4a;

FIGS. 5–10 are sectional views illustrating the method according to the invention and the resulting structure;

FIG. 11 is a diagrammatic plan view onto a number of memory cells of the structure of FIG. 10;

FIG. 12 is a diagrammatic sectional view taken along the line XII—XII in FIG. 10.

DESCRIPTION OF THE PREFERRED EMBODIMENTS

Figure 8:
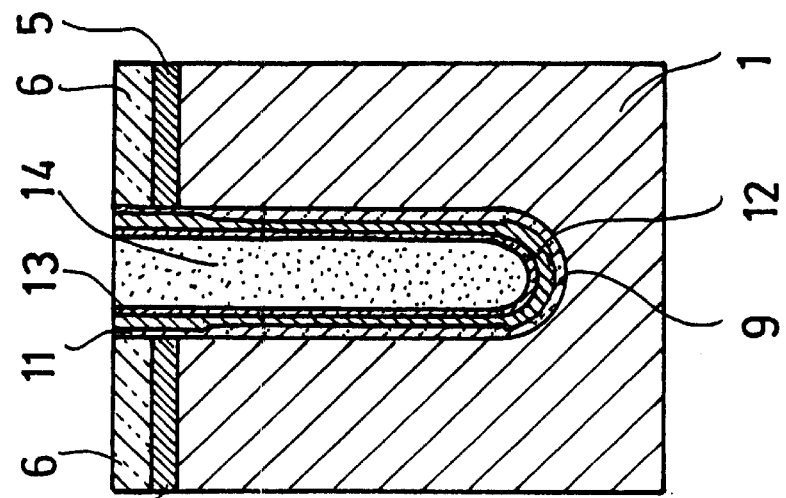

Referring now to the figures of the drawing in detail and first, particularly, to FIG. 1 thereof, there is seen a silicon substrate 1 that is first provided, on its surface, with a thin silicon dioxide layer 2, which acts in ensuing process steps as an etch stop layer. The layer 2 is 10 nm thick, for instance. Onto the silicon dioxide layer 2, a double layer of a silicon nitride layer 3 and a silicon dioxide layer 4 are then applied. The silicon nitride layer 3 acts as a stop layer for subsequent CMP steps and at the same time keeps the capacitance between later-formed word lines WL (see FIGS. 10 and 13) and the silicon substrate 1 low. The double layer is subsequently structured. Then an ion implantation is performed, in order to form diffusion zones 5 corresponding to the source and drain.

The resulting structure is shown in FIGS. 1a and 1b. The diffusion zones 5 are shaded in the plan view of FIG. 1a for clarity.

Next, a further silicon dioxide layer, which is of the same type as the silicon dioxide layer 4 and is made for instance by CVD (chemical vapor deposition), is applied. This silicon dioxide layer 6 is back-polished or back-etched until the silicon nitride layer 3 is reached. The usual chemical-mechanical polishing (CMP) or plasma etching may be employed for this purpose.

The resulting structure is shown in FIGS. 2a and 2b, in which alternating strips of silicon nitride layers 3 and silicon dioxide layers 6 are disposed on the semiconductor body 1. In the plan view of FIG. 2a—analogously to FIG. 1a—the individual silicon nitride layers 3 are shown shaded.

To furnish suitable structures for a subsequent trench etching operation, a further layer, such as a polycrystalline silicon layer 7, is then applied and structured vertically to the course of the silicon nitride layers 3. This further layer should, however, be etchable selectively to the silicon nitride layer 3 and the silicon dioxide layer 4, which is which the polycrystalline silicon is used.

The result is thus a structure as shown in FIGS. 3a and 3b; FIG. 3b is a section along the line B—B of FIG. 3a.

It should be noted that to simplify the drawing, the silicon dioxide layer 2 has not been shown in FIGS. 2b and 3b.

Next, the regions between the lattice structure formed of the silicon dioxide layer 4 and the memory cell layer 7—that is, the bared regions of the silicon nitride layer 3 in FIG. 3a—are etched away, so that here the surface of the silicon dioxide layer 2 is laid bare on the silicon substrate 1. This etching is done selectively to the silicon dioxide layer 6 and the polycrystalline silicon layer 7. Next, with the aid of a wet chemical step, the polycrystalline silicon layer 7 is removed by stripping. For example, choline etches polycrystalline silicon, but not silicon dioxide.

Thus the structure shown in FIGS. 4a and 4b is obtained; FIG. 4b shows a section taken along the line A—A of FIG. 4a. Thus a structure is obtained in which in each individual memory cell, the silicon dioxide layer 2 is laid bare on the silicon substrate 1; the holes leading to the silicon substrate 1 covered with the silicon dioxide layer 2 are surrounded on both sides by the silicon dioxide layer 6 and/or by the residues of the silicon nitride layer 3.

A netlike surface is thus obtained. The "net" is formed by the silicon dioxide layers 6 and the residues of the silicon nitride layer 3. The "net" now acts as a mask for the ensuing trench etching process.

In FIG. 5 there is shown an enlarged view of a single cell, for instance the cell D of FIG. 4a, after the trench etching process. A trench 8 is formed here in the region of the bared surface of the silicon substrate 1.

Next, a conformal deposition of a dielectric 9, for instance of silicon dioxide, in the trench is performed; this dielectric 9 has a relatively great thickness, so that under the later-formed floating gate there is a small capacitance to the silicon substrate 1. In addition, the trench 8 is filled with an auxiliary layer 10, for instance of planarizing resist. This auxiliary layer 10 is back-polished or back-etched selectively down to the dielectric 9, or to the silicon dioxide layer 6. This is followed by an anisotropic back-etching of the dielectric 9 and the auxiliary layer 10, down to a depth of 100 to 500 nm, for instance.

Figure 6:
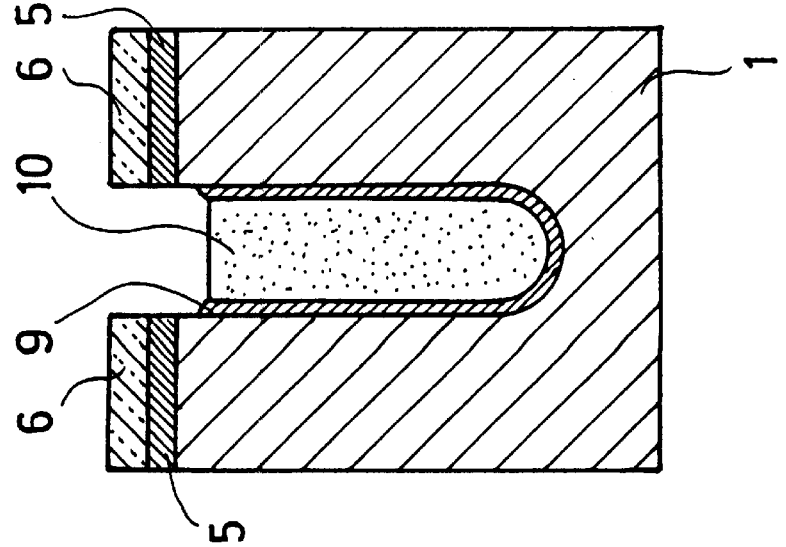

The result is the structure shown in FIG. 6. The trench here is substantially filled, in the region of the silicon substrate 1, by the dielectric 9 and the auxiliary layer 10.

The auxiliary layer 10 is then removed by stripping. This can be done wet-chemically, for instance, with the aid of a solvent, hydrofluoric acid, or by plasma etching with the aid of an acid plasma. If the dielectric is of silicon dioxide, then it would be etched by hydrofluoric acid. Yet the dielectric 9 should be resistant to hydrofluoric acid. In other words, hydrofluoric acid can be used whenever the dielectric 9 is resistant to it. Next, a side wall oxide layer 11 of silicon dioxide, for instance, is formed in the open upper region of the trench 8.

Figure 7:
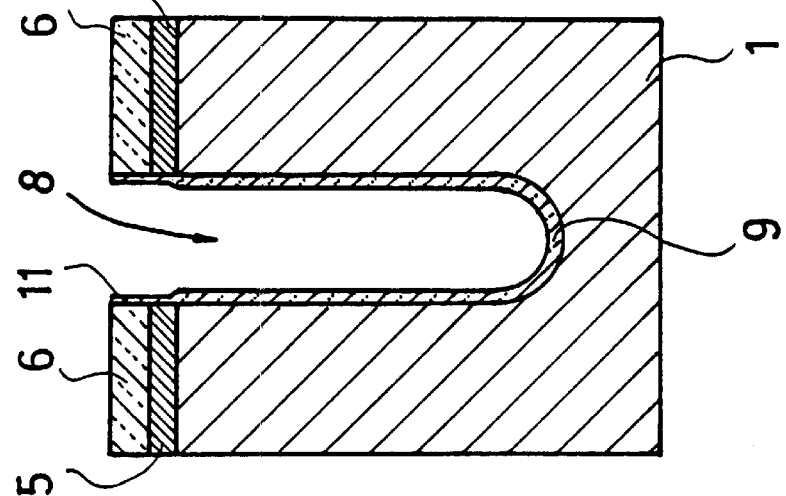

The result is now the structure shown in FIG. 7, in which the side wall oxide layer 11 already forms the tunnel oxide of the later MOS transistor.

Next, a floating gate layer of polycrystalline silicon, doped in situ, is conformally deposited in the trench 8. Because of the shoulder at the upper edge of the dielectric 9 in the transitional region to the side wall oxide layer 11, the floating gate layer 12 also has a shoulder, which is true for the ensuing layers as well. To make the drawing simpler, this shoulder is not shown in the floating gate layer 12 or the following layers. Next, a conformal deposition of an interpolydielectric 13, for instance comprising an oxide film and a nitride film (ON) and an auxiliary layer 14 that fills up the trench, is done. The same material can be used for the auxiliary layer 14 as for the auxiliary layer 10. Finally, the floating gate layer 12, the interpolydielectric 13 and the auxiliary layer 14 are also selectively back-polished or back-etched, so that they are at the same level as the upper edge in the silicon dioxide layer 6.

This produces the structure shown in FIG. 8.

Figure 9:
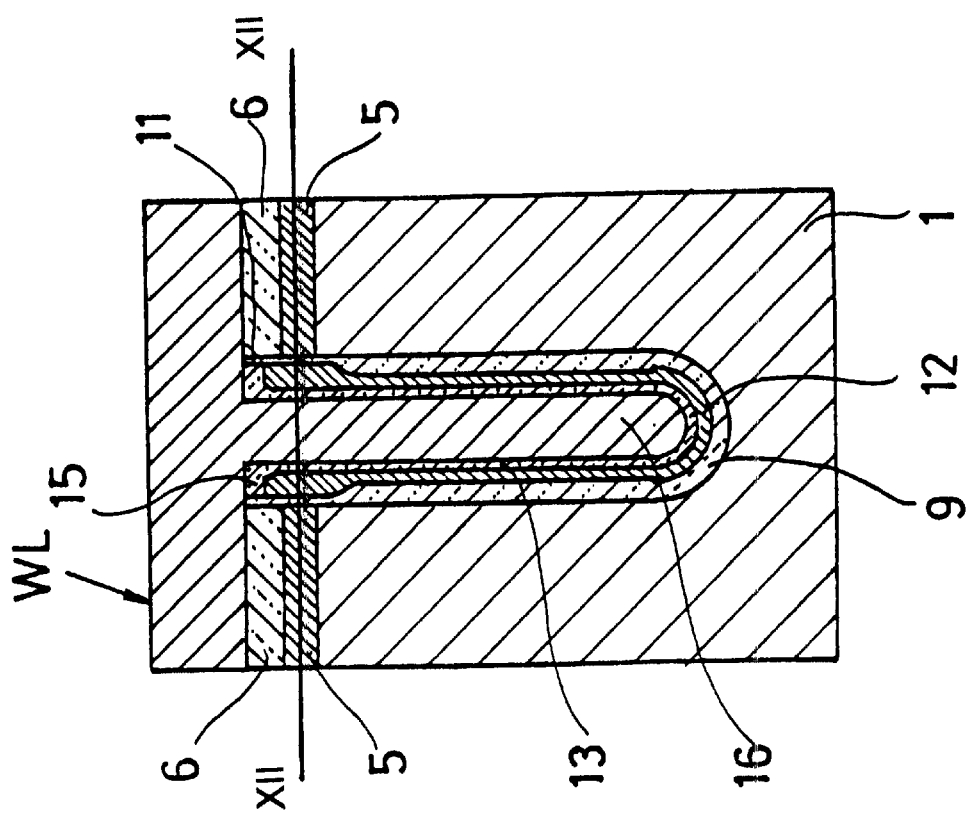

After removal of the auxiliary layer 14 in the trench 8 by stripping, a thermal oxidation is performed, thus forming a top oxide, so that a so-called ONO (oxide-nitride-oxide) structure is present in the region of the interpolydielectric 13. At the same time, the bared floating gate layer 12 is top-oxidized and thus completely encapsulated. In FIG. 9, the region of the top oxide is indicated by reference numeral 15.

The floating gate layer 12 is now entirely encapsulated by an insulation. It is surrounded by the interpolydielectric 13, the top oxide 15, the dielectric 9, and the side wall oxide layer 11. In the thermal oxidation to form the "encapsulation oxide", the fact is exploited that because of the known acceleration factor, doped polycrystalline silicon, which is the material comprising the floating gate layer 12, is top-oxidized significantly more markedly than undoped polycrystalline silicon. In FIG. 9, the known "bird's beak" can also be seen, which forms between the floating gate layer 12 and the interpolydielectric 12. This "beak" is typical and is not a problem; however, it is not absolutely intentional.

Next, the trench 8 is filled with doped polycrystalline silicon by deposition, and the polycrystalline silicon is then back-polished or back-etched. This creates a control gate layer 16 in the trench 8.

The structure shown in FIG. 9 is the result; it has a completely planar surface.

Figure 10:
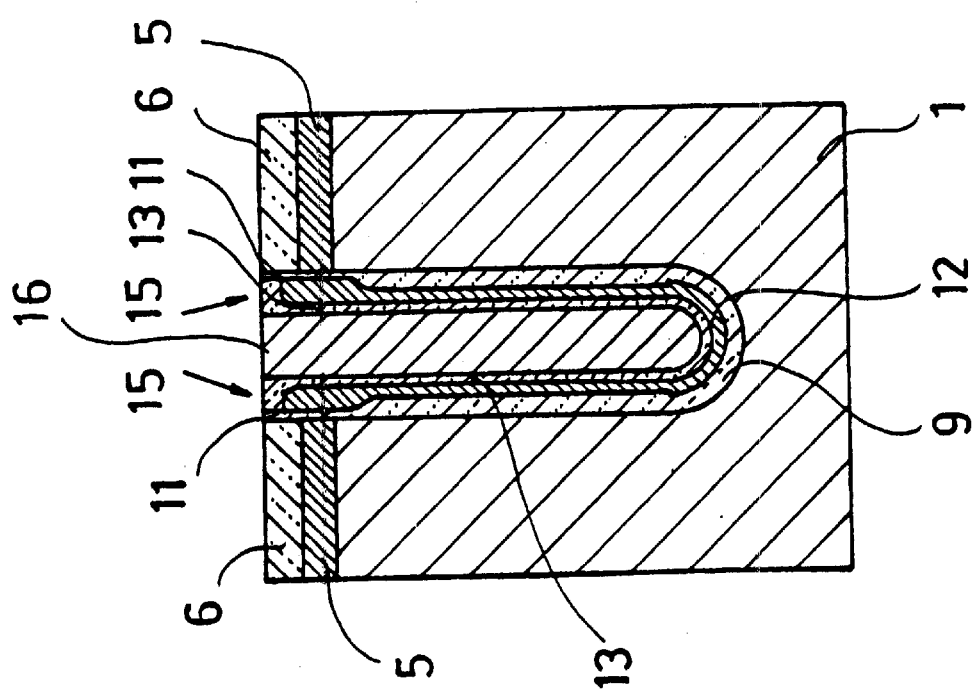

Onto this planar surface, word lines WL with an ohmic connected to the control gate layers 16 are now deposited and structured. This structuring is done along with adjustment to the meanwhile fully filled trench 8, so that finally the structure shown in FIG. 10 is obtained. A plan view on a plurality of memory cells of FIG. 10 is shown in FIG. 11. FIG. 12, finally, shows a section taken along the line C—C through memory cells of FIG. 10. In FIGS. 11 and 12, for the sake of simplifying the drawing, only the word lines WL, the floating gate layer 12 and the control gate layer 16 are shown shaded.

A slightly maladjustment of the word lines WL to the control gate layers 16 is tolerable; since the word lines WL and the control gate layers are electrically conductive, an adequate electrical connection between the word lines WL and the control gate layers will therefore take place in all the cells. In metallizing, such overlaps are known as "non-nested."

In FIG. 12, a transistor channel 17 is extended along the outer surface of the earlier trench 8. The overlapping region between the floating gate layer and the control gate layer 16 is embodied in the trench 8, however, and is relatively large. As a result, good capacitive coupling is achieved here between the control gate layer 16 and the floating gate layer 12.

In the memory cells of FIGS. 11 and 12, the side edges of a unit cell each amount to twice the minimum feasible feature length F, so that a memory cell area of $4F^2$ is obtained. As shown in FIG. 12, for instance, the trench 8 is approximately circular, which pays due respect to the fact that the "net" mentioned above comprising the silicon dioxide layer 6 and the polycrystalline silicon layer 7 in formed with essentially circular holes. Instead of a circular design, other shapes, in which the corners are rounded, may also be selected.

Figure 13:
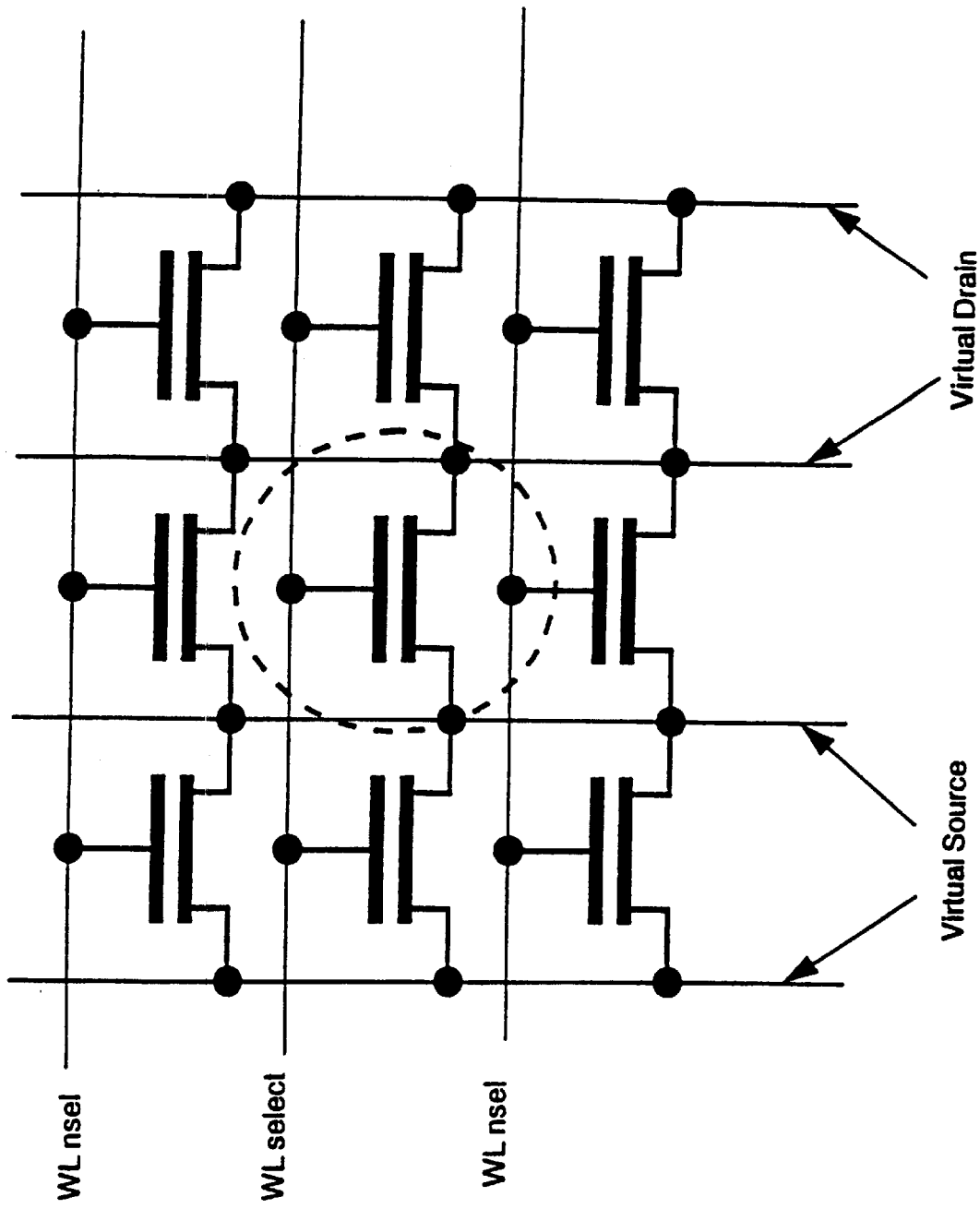
FIG. 13 is a circuit with memory cells according to the invention.

FIG. 13, finally, shows the circuit of a memory cell arrangement with selective word line WL select and nonselective word lines WL nsel, and with a virtual source and a virtual drain. If this middle cell of this circuit is selected, as indicated by its being outlined in dashed lines, then the programming capability by means of "hot" charge carriers will for example be as follows:

|  | WL Select | WL nsel | Virtual Source | Virtual Drain | |
|---|---|---|---|---|---|
| Write | +12V | 0V | 0V | +5V | Vth↑ |
| Erase | −18V | 0V | 0V | 0V | Vth↓ |
| Read | +5V | 0V | 0V | +1V | |

By means of a decoder, it can be assured that all the cells on the drain side of the selected cell will receive the same drain voltage. This assures that these cells will not have any voltage drop and thus will have no individual source-to-drain current between the bit lines. The same condition must be met for all the cells on the source side.

In the erase mode, in general entire blocks are erased, so that a distinction between WL select and WL nsel can be omitted in some circumstances. Also, erasing can be done here for instance with a WL voltage of −12 V and a source-to-drain voltage of +5 V, or with a positive substrate voltage.

The invention makes a non-volatile memory cell, produced in self-adjusted form, possible in which the transistor channel extends in the surface region of a semiconductor body, while the floating gate and the control gate are accommodated, overlapping one another, in a trench. The surface of the semiconductor body with the trench is completely planar, which makes it excellently well suited to the application of word lines or for other lithographic operations.

I claim:

1. A non-volatile memory cell, comprising:
   a semiconductor substrate having a surface formed with source and drain regions and a channel region formed between said source and drain regions;
   said semiconductor substrate having a cup-shaped recess formed therein between said source and drain regions;
   a fully insulated storage gate electrode disposed in said recess in said semiconductor substrate;
   a control gate electrode protruding into said recess and capacitively coupled with said storage gate electrode;
   a gate oxide disposed between and insulating said storage gate electrode from said semiconductor substrate, said gate oxide being relatively thinner in a region at said surface of said semiconductor substrate than in said recess; and
   said channel region, at said relatively thinner gate region oxide, extending horizontally around said recess at said surface of said semiconductor substrate.

2. The non-volatile memory cell according to claim 1, wherein said fully insulated storage gate electrode embraces said control gate electrode in a U, and said control gate electrode is disposed centrally in said recess.

3. The non-volatile memory cell according to claim 1, which further comprises silicon dioxide layers completely surrounding said fully insulated storage gate electrode.

4. The non-volatile memory cell according to claim 1, wherein said fully insulated storage gate electrode and said control gate electrode each comprise doped polycrystalline silicon.

* * * * *

UNITED STATES PATENT AND TRADEMARK OFFICE
CERTIFICATE OF CORRECTION

PATENT NO : 6,025,626
DATED : February 15, 2000
INVENTOR(S) : Georg Tempel

It is certified that error appears in the above-identified patent and that said Letters Patent is hereby corrected as shown below:

Title page,
Item [30] should read as follows:

Sept. 23, 1996     [DE]    Germany .......... 196 39 026.5

Signed and Sealed this

Ninth Day of January, 2001

Attest:

Q. TODD DICKINSON

Attesting Officer     Commissioner of Patents and Trademarks